United States Patent
Cheng et al.

(10) Patent No.: US 9,431,425 B1
(45) Date of Patent: Aug. 30, 2016

(54) DIRECTLY FORMING SIGE FINS ON OXIDE

(71) Applicant: INTERNATIONAL BUSINESS MACHINES CORPORATION, Armonk, NY (US)

(72) Inventors: Kangguo Cheng, Schenectady, NY (US); Hong He, Schenectady, NY (US); Juntao Li, Cohoes, NY (US); Junli Wang, Singerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/674,586

(22) Filed: Mar. 31, 2015

(51) Int. Cl.

| | | |
|---|---|---|
| *H01L 21/336* | (2006.01) | |
| *H01L 21/8234* | (2006.01) | |
| *H01L 21/8238* | (2006.01) | |
| *H01L 27/12* | (2006.01) | |
| *H01L 21/84* | (2006.01) | |
| *H01L 27/092* | (2006.01) | |
| *H01L 29/161* | (2006.01) | |
| *H01L 29/06* | (2006.01) | |
| *H01L 21/762* | (2006.01) | |
| *H01L 29/16* | (2006.01) | |
| *H01L 21/02* | (2006.01) | |

(52) U.S. Cl.
CPC ..... *H01L 27/1211* (2013.01); *H01L 21/02532* (2013.01); *H01L 21/76283* (2013.01); *H01L 21/845* (2013.01); *H01L 27/092* (2013.01); *H01L 29/0649* (2013.01); *H01L 29/16* (2013.01); *H01L 29/161* (2013.01)

(58) Field of Classification Search
CPC ........... H01L 21/845; H01L 21/02532; H01L 21/76283; H01L 27/092; H01L 27/1211; H01L 29/16; H01L 29/785; H01L 29/0649; H01L 29/66795

USPC ............... 438/154, 157, 197, 275, 283, 425; 257/192, 347, 351, 397, E21.09, 257/E21.618, E21.619, E21.633, E21.636, 257/E29.024, E29.056, E29.255, E27.112

See application file for complete search history.

(56) References Cited

U.S. PATENT DOCUMENTS

| | | | |
|---|---|---|---|
| 8,373,217 B2 | 2/2013 | Chang | |
| 8,420,471 B2* | 4/2013 | Anderson | ....... H01L 21/823412 257/E21.618 |
| 2014/0357034 A1* | 12/2014 | Cheng | .................. H01L 29/785 438/275 |
| 2015/0295087 A1* | 10/2015 | Cheng | ................. H01L 29/7851 257/192 |
| 2016/0133528 A1* | 5/2016 | Cheng | .................. H01L 21/845 257/351 |

* cited by examiner

*Primary Examiner* — Dao H Nguyen
(74) *Attorney, Agent, or Firm* — Scully, Scott, Murphy & Presser, P.C.; Steven J. Meyers

(57) ABSTRACT

Semiconductor mandrel structures are formed extending upward from a remaining portion of a semiconductor substrate. A first oxide isolation structure is formed on exposed surfaces of the remaining portion of the semiconductor substrate and between each semiconductor mandrel structure. A silicon germanium alloy fin is formed on opposing sidewalls of each semiconductor mandrel structure that is present in a pFET device region of the semiconductor substrate and directly on a surface of each first oxide isolation structure. Each semiconductor mandrel structure is removed and a second oxide isolation structure is formed between each first oxide isolation structure and extending beneath a bottommost surface of each first oxide isolation structure.

10 Claims, 6 Drawing Sheets

DIRECTLY FORMING SIGE FINS ON OXIDE

BACKGROUND

The present application relates to a semiconductor structure and a method of forming the same. More particularly, the present application relates to a semiconductor structure that includes silicon germanium alloy fins located directly on a topmost surface of an oxide, and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In order to extend these devices for multiple technology nodes, there is a need to boost the performance with high-mobility channels.

A silicon germanium alloy (i.e., SiGe) is one promising channel material because of its high-carrier mobility. SiGe fins can be formed by epitaxially growing a SiGe alloy layer on a surface of a silicon (Si) substrate and then patterning the SiGe alloy layer. This prior art method of forming SiGe fins has some drawbacks associated therewith. For example, the direct epitaxial growth of SiGe on a Si substrate has a critical thickness limit. Above the critical thickness, SiGe is very defective and is not suitable for use as a device channel material. This prevents a thick SiGe layer for high fin height. Moreover, SiGe fins formed on a bulk Si substrate show a punch-though below the channel region. Furthermore, for current 7 nm technology, two sidewall image transfer (SIT) processes are needed to pattern fins having a 40 nm pitch. As such, process complexity is increased for current 7 nm technology due to the required need to use two SIT processes.

In view of the above, there is a need for providing a method of forming SiGe fins that avoids the drawbacks associated with prior art SiGe fin formation.

SUMMARY

Semiconductor mandrel structures are formed extending upward from a remaining portion of a semiconductor substrate. A first oxide isolation structure is formed on exposed surfaces of the remaining portion of the semiconductor substrate and between each semiconductor mandrel structure. A silicon germanium alloy fin is formed on opposing sidewalls of each semiconductor mandrel structure that is present in a pFET device region of the semiconductor substrate and directly on a surface of each first oxide isolation structure. Thus, and for each semiconductor mandrel structure that is formed in the pFET device region, two silicon germanium alloy fins can be formed doubling the density of the silicon germanium alloy fins that can be formed. Each semiconductor mandrel structure is removed and a second oxide isolation structure is formed between each first oxide isolation structure and extending beneath a bottommost surface of each first oxide isolation structure.

In one aspect of the present application, a method of forming a semiconductor structure is provided. In one embodiment the method of the present application includes proving a structure comprising a plurality of semiconductor mandrel structures containing a nitride-containing hard mask cap and extending upward from a semiconductor substrate, wherein a first oxide isolation structure is located between each semiconductor mandrel structure and on exposed portions of the semiconductor substrate. Next, a silicon germanium alloy fin is formed on opposing sidewalls of each semiconductor mandrel structure in a pFET device region of the semiconductor substrate, wherein each silicon germanium alloy fin has a bottommost surface that directly contacts a topmost surface of one of the first oxide isolation structures. Each nitride-containing hard mask cap and each semiconductor mandrel structure are then removed, and thereafter a second oxide isolation structure is formed between each first oxide isolation structure. The second oxide isolation structure that is formed has a topmost surface that is coplanar with a topmost surface of each first oxide isolation structure and a bottommost surface that is deeper than a bottommost surface of each first oxide isolation structure.

In another aspect of the present application, a semiconductor structure is provided. In one embodiment, the semiconductor structure includes a plurality of silicon germanium alloy fins located within a pFET device region of a semiconductor substrate, wherein each silicon germanium alloy fin is located directly on a first oxide isolation structure and wherein one sidewall surface of each silicon germanium alloy fin is vertically aligned to a sidewall edge of one of the first oxide isolation structures. The semiconductor structure also includes a second oxide isolation structure located between each of the first oxide isolation structures, wherein each of the second oxide isolation structures has a depth that is deeper than a depth of the first oxide isolation structures.

DETAILED DESCRIPTION

Figure 1:
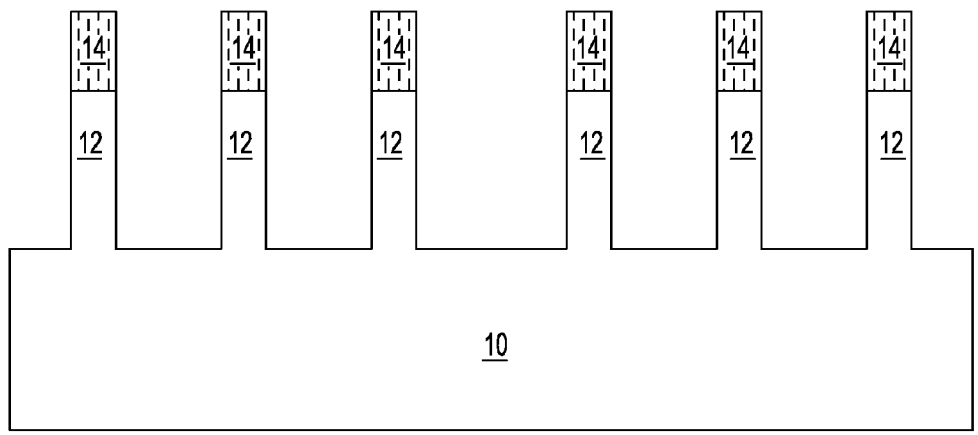
FIG. 1 is a cross sectional view of an exemplary semiconductor structure including a plurality of semiconductor mandrel structures extending upwards from a remaining portion of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a plurality of semiconductor mandrel structures 12 extending upwards from a remaining portion of a semiconductor substrate 10 (or just semiconductor substrate 10 for short). Each semiconductor mandrel structure 12 may be capped with a nitride-containing hard mask cap 14. As is shown, sidewall surfaces of each semiconductor mandrel structure 12 are vertically aligned with sidewall surfaces of an overlying nitride-containing hard mask cap 14. Each semiconductor mandrel structure 12 comprises a topmost single crystalline semiconductor material portion of a bulk semiconductor substrate.

The exemplary semiconductor structure shown in FIG. 1 can be formed by first providing a bulk semiconductor substrate, forming a blanket layer of a nitride-containing hard mask on the surface of the bulk semiconductor substrate and performing a patterning process. The term "bulk" as used in conjunction with the phrase "semiconductor substrate" denotes that the entire substrate is comprised of at least one semiconductor material. In accordance with the present application, at least a topmost semiconductor portion of the bulk semiconductor substrate in which the semiconductor mandrel structures are formed is single crystalline.

The bulk semiconductor substrate may comprise any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate can be comprised of a single crystalline semiconductor material, such as, for example, single crystalline silicon. The crystal orientation of the bulk semiconductor substrate may be {100}, {110}, or {111}. Other crystallographic orientations besides those specifically mentioned can also be used in the present application.

The blanket layer of nitride-containing hard mask material that is present on a topmost surface of the bulk semiconductor substrate is a contiguous layer that covers the entirety of the topmost surface of the bulk semiconductor substrate. The nitride-containing hard mask material that is employed in the present application may include a semiconductor nitride and/or a semiconductor oxynitride. In one embodiment, the nitride-containing hard mask material can be composed of silicon nitride or silicon oxynitride. In yet another embodiment, the nitride-containing hard mask material that can be used in the present application can be a stack comprised of, in any order, silicon oxynitride and silicon nitride.

In some embodiments, the blanket layer of nitride-containing hard mask material can be formed by a deposition process such as, for example, chemical vapor deposition (CVD) or plasma enhanced chemical vapor deposition (PECVD). In other embodiments, blanket layer of nitride-containing hard mask material can be formed by a thermal nitridation process. In yet other embodiments, the blanket layer of nitride-containing hard mask material can be formed by a combination of a deposition process and a thermal nitridation process. In one embodiment of the present application, the thickness of the blanket layer of nitride-containing hard mask material can range from 1 nm to 10 nm. Other thickness that are lesser than, or greater than, the aforementioned thickness range may also be employed as the thickness of the blanket layer of nitride-containing hard mask material.

The plurality of semiconductor mandrel structures 12 can be formed by patterning the blanket layer of nitride-containing hard mask material and the bulk semiconductor substrate. The portions of the blanket layer of nitride-containing hard mask material that remain after patterning are referred to herein as the nitride-containing hard mask caps 14. The non-etched portion of the bulk semiconductor substrate that remains after patterning is referred to herein as a remaining portion of the semiconductor substrate 10. Since the semiconductor mandrel structures 12 are formed from a bulk semiconductor substrate, there is no material interface that exists between each semiconductor mandrel structure 12 and the remaining portion of the semiconductor substrate 10.

In one embodiment of the present application, the patterning process includes lithography and etching. Lithography includes forming a photoresist material (not shown) on a surface of the blanket layer of nitride-containing hard mask material. The photoresist material may include a positive-tone material, a negative tone material, or hybrid tone material. The photoresist material can be formed as a blanket layer by a deposition process such as, for example, spin-on coating, CVD, PECVD, evaporation or chemical solution deposition. The blanket layer of photoresist material is then exposed to a desired pattern of irradiation and then the exposed photoresist material is developed utilizing a conventional resist developer. After developing the exposed photoresist material, an anisotropic etch is used to transfer the pattern into the blanket layer of hard mask material. Examples of anisotropic etching processes that can used to transfer the pattern may include dry etching (i.e., reactive ion etching, plasma etching, ion beam etching or laser ablation) and/or a chemical wet etch process. In one example, the anisotropic etch process used to transfer the pattern may include a reactive ion etch. Upon completion of the pattern transfer, the remaining portions of the photoresist material are removed utilizing a resist stripping process such as, for example, ashing.

In another embodiment of the present application, the patterning process includes a sidewall image transfer (SIT) process. The SIT process includes forming a contiguous mandrel material layer (not shown) on the topmost surface of the blanket layer of nitride-containing hard mask material. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of blanket layer of nitride-containing hard mask material.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each semiconductor mandrel structure 12.

After formation of the dielectric spacers, the SIT process continues by removing each mandrel structure. Each mandrel structure can be removed by an etching process that is selective for removing the mandrel material as compared to the material of the dielectric spacers blanket layer of nitride-containing hard mask material. Following the mandrel structure removal, the SIT process continues by transferring the pattern provided by the dielectric spacers into the blanket layer of nitride-containing hard mask material and then into the bulk semiconductor substrate. The pattern transfer may be achieved by an anisotropic etching process as defined above. Upon completion of the pattern transfer, the SIT process concludes by removing the dielectric spacers from the structure. Each dielectric spacer may be removed by etching or a planarization process.

As mentioned above, the patterning process that is employed provides semiconductor mandrel structures 12 extending upwards from a remaining portion of the semiconductor substrate 10. Each semiconductor mandrel structure 12 may be capped with a nitride-containing hard mask cap 14. In one embodiment of the present application, each semiconductor mandrel structure 12 and each nitride-containing hard mask cap 14 has a width from 4 nm to 40 nm. In another embodiment of the present application, each semiconductor mandrel structure 12 and each nitride-containing hard mask cap 14 has a width from 5 nm to 20 nm. In one embodiment of the present application, the height of each semiconductor mandrel structure 12 is from 20 nm to 200 nm. Other heights that or lesser than, or greater than, the aforementioned range are also possible.

Figure 2:
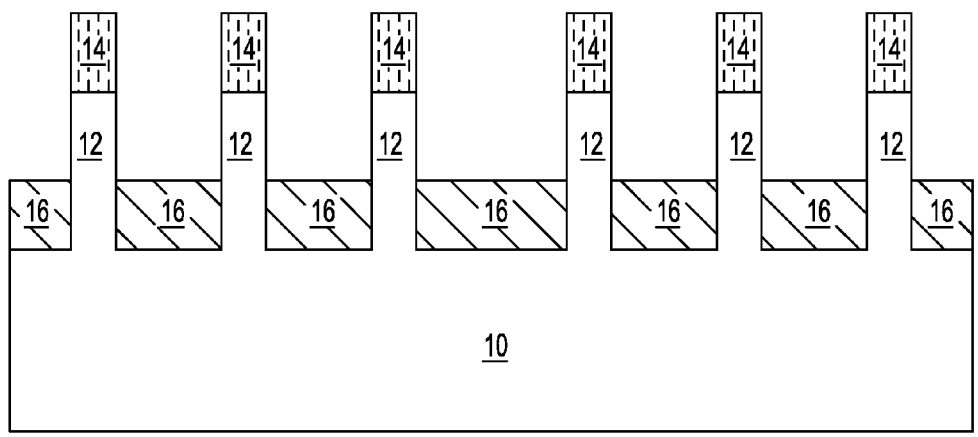
FIG. 2 is a cross sectional view of the exemplary semiconductor structure of FIG. 1 after forming an oxide isolation structure on exposed surfaces of the remaining portion of the semiconductor substrate and between each semiconductor mandrel structure.

Referring now to FIG. 2, there is illustrated the exemplary semiconductor structure of FIG. 1 after forming an oxide isolation structure 16 on exposed surfaces of the remaining portion of the semiconductor substrate 10 and between each semiconductor mandrel structure 12. The oxide isolation structure 16 can be formed by first depositing an oxide material such as, for example, silicon dioxide. An anneal (i.e., densification) process may follow the deposition of the trench dielectric material. An etch back process may follow the deposition of the oxide material.

As is shown, each oxide isolation structure 16 has a bottommost surface that forms an interface with a remaining portion of the semiconductor substrate 10. Each oxide isolation structure 16 also has a sidewall edge that contacts a portion of a sidewall of one of the semiconductor mandrel structures 12. A top portion of the sidewalls of each semiconductor mandrel structure 12 remains exposed after forming the oxide isolation structure 16. In one embodiment of the present application, the thickness of the oxide isolation structure 16 is from 10 nm to 30 nm.

Figure 3:
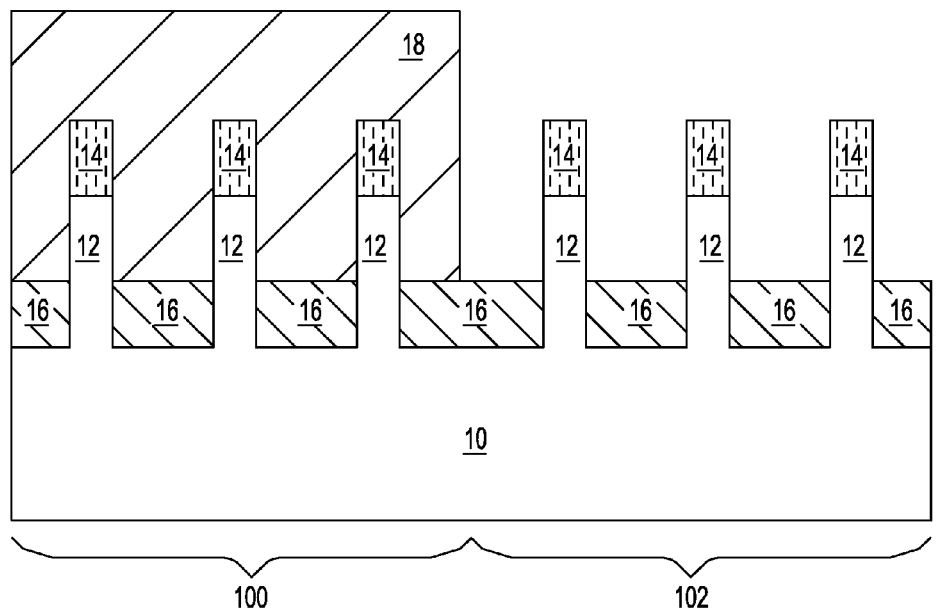
FIG. 3 is a cross sectional view of the exemplary semiconductor structure of FIG. 2 after forming a first block mask over an nFET device region of the remaining portion of the semiconductor substrate.

Referring now to FIG. 3, there is illustrated the exemplary semiconductor structure of FIG. 2 after forming a first block mask 18 over an nFET device region 100 of the remaining portion of the semiconductor substrate 10; the semiconductor mandrel structures in a pFET device region 103 of the semiconductor substrate 10 are exposed. The first block mask 18 can be comprised of material that has a different etch rate than the oxide isolation structure 16, the nitride-containing hard mask caps 14 and the exposed sidewall portions of the semiconductor mandrel structures 12. In one embodiment of the present application, the first block mask 18 may be composed of amorphous carbon. In some embodiments, the first block mask 18 may be comprised of a photoresist material.

The first block mask 18 can be formed by depositing a block mask material, and thereafter patterning the block mask material. The deposition of the block mask material may include CVD, PECVD, spin-on coating, evaporation or chemical solution deposition. The patterning of the block mask may be performed by lithography alone, or lithography and etching may be used. As is shown, the height of the first block mask covers the entirety of each patterned stack of, from bottom to top, semiconductor mandrel structure 12 and nitride-containing hard mask cap 14.

Figure 4:
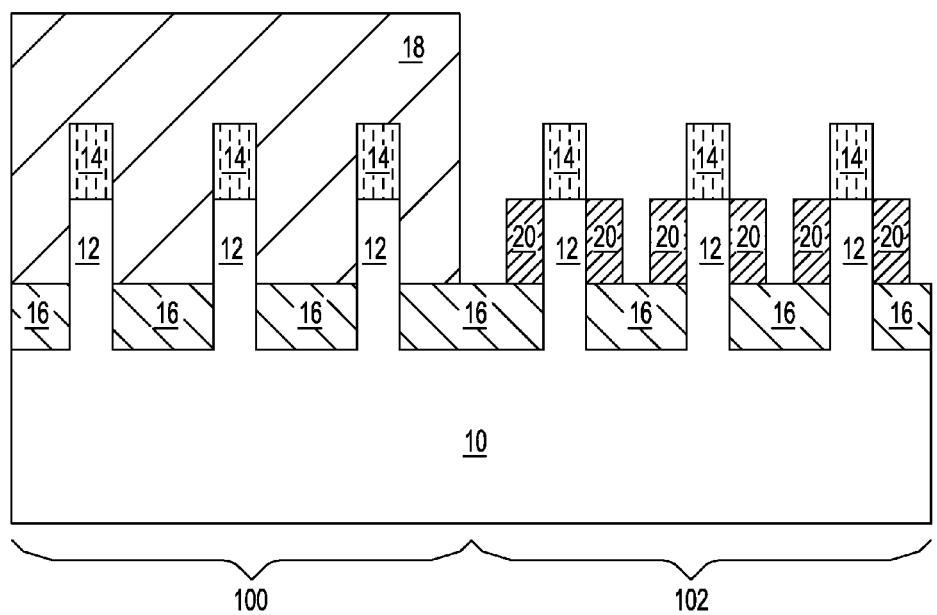
FIG. 4 is a cross sectional view of the exemplary semiconductor structure of FIG. 3 after epitaxially growing a silicon germanium alloy fin from opposing sidewalls of each semiconductor mandrel structure that is located in a pFET device region of the remaining portion of the semiconductor substrate.

Referring now to FIG. 4, there is illustrated the exemplary semiconductor structure of FIG. 3 after epitaxially growing a silicon germanium alloy fin 20 from exposed sidewalls of each semiconductor mandrel structure 12 that is located in the pFET device region 102 of the remaining portion of the semiconductor substrate 10. As used herein, a "fin" refers to a contiguous structure including a semiconductor material, in the present case a silicon germanium alloy, and including a pair of vertical sidewalls that are parallel to each other. As used herein, a surface is "vertical" if there exists a vertical plane from which the surface does not deviate by more than three times the root mean square roughness of the surface.

As is shown, each silicon germanium alloy fin 20 that is formed in the pFET device region 102 has a sidewall that contacts a sidewall of semiconductor mandrel structure 12. Also, each silicon germanium alloy fin 20 that is formed has a bottommost surface that is formed on a topmost surface of the oxide isolation structure 16. Further, and in some embodiments, each silicon germanium alloy fin 20 that is formed has a topmost surface that is coplanar with a topmost surface of the semiconductor mandrel structure 12. In some embodiments, the topmost surface of each silicon germanium alloy fin 20 formed in the pFET device region 102 may be located beneath a topmost surface of the semiconductor mandrel structure 12. As is shown, one sidewall surface of each silicon germanium alloy fin 20 that is formed is vertically aligned to a sidewall edge of an underlying oxide isolation structure 16.

In one embodiment, each silicon germanium alloy fin 20 that is formed in the pFET device region 102 may have a germanium content from 10 atomic percent (%) germanium to 90 atomic % germanium. In another embodiment, each silicon germanium alloy fin 20 that is formed in the pFET device region 102 may have a germanium content from 20 atomic % germanium to 80 atomic % germanium.

In one embodiment of the present application, each silicon germanium alloy fin 20 that is formed in the pFET device region 102 has height from 15 nm to 100 nm and a width from 4 nm to 40 nm. In another embodiment of the present application, each silicon germanium alloy fin 20 that is formed in the pFET device region 102 has a height from 30 nm to 60 nm, and a width from 5 nm to 20 nm.

As mentioned above, each silicon germanium alloy fin 20 is formed by an epitaxial growth (i.e., deposition") process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces. In the present application, each silicon germanium alloy fin 20 that is formed has an epitaxial relationship with a sidewall surface of one of the semiconductor mandrel structures 12 in the pFET device region 102.

Examples of various epitaxial growth processes that are suitable for use in forming epitaxial semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking.

A number of different source gases may be used for the deposition of each silicon germanium alloy fin 20. In some embodiments, the source gas for the deposition of each silicon germanium alloy fin 20 includes a mixture of a silicon containing gas source and a germanium containing gas source. In other embodiments, the source gas for the deposition of each silicon germanium alloy fin 20 includes a silicon and germanium containing source gas. Carrier gases like hydrogen, nitrogen, helium and argon can be used.

Figure 5:
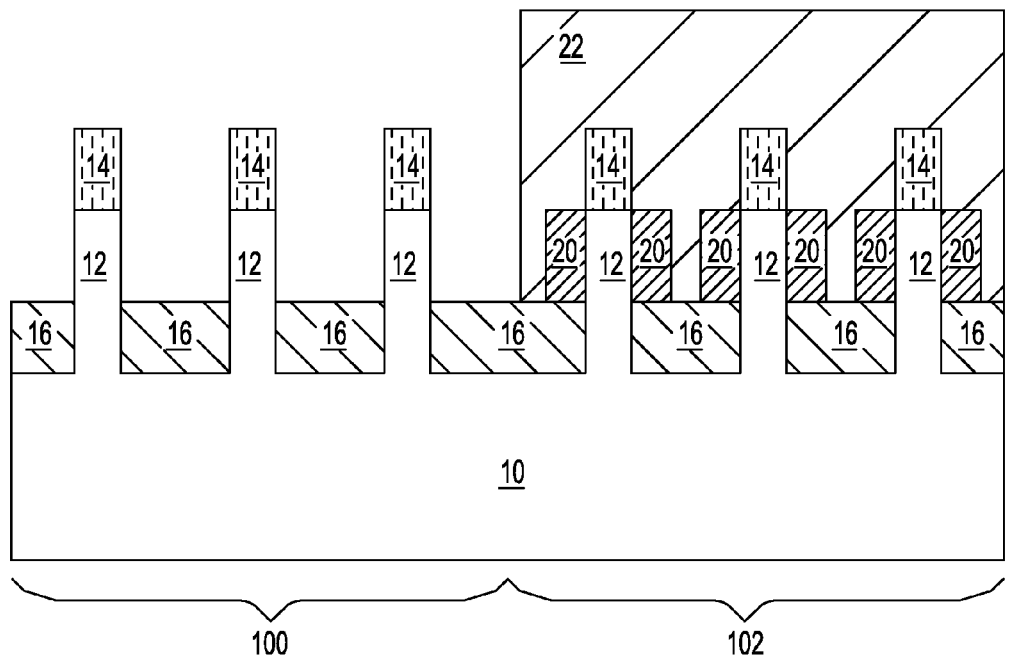
FIG. 5 is a cross sectional view of the exemplary semiconductor structure of FIG. 4 after removing the first block mask and forming a second block mask over the pFET device region of the remaining portion of the semiconductor substrate.

Referring now to FIG. 5, there is illustrated the exemplary semiconductor structure of FIG. 4 after removing the first block mask 18 and forming a second block mask 22 over the pFET device region 102 of the remaining portion of the semiconductor substrate 10. The first block mask 18 can be removed utilizing an etch back process that is selective for removing the block mask material that provides the first block mask 18. The second block mask 22 that is provided over the pFET device region 102 can include one of the block mask materials mentioned above for providing the first block mask 18. The second block mask 22 can be formed by deposition and patterning as defined above for providing the first block mask 18.

Figure 6:
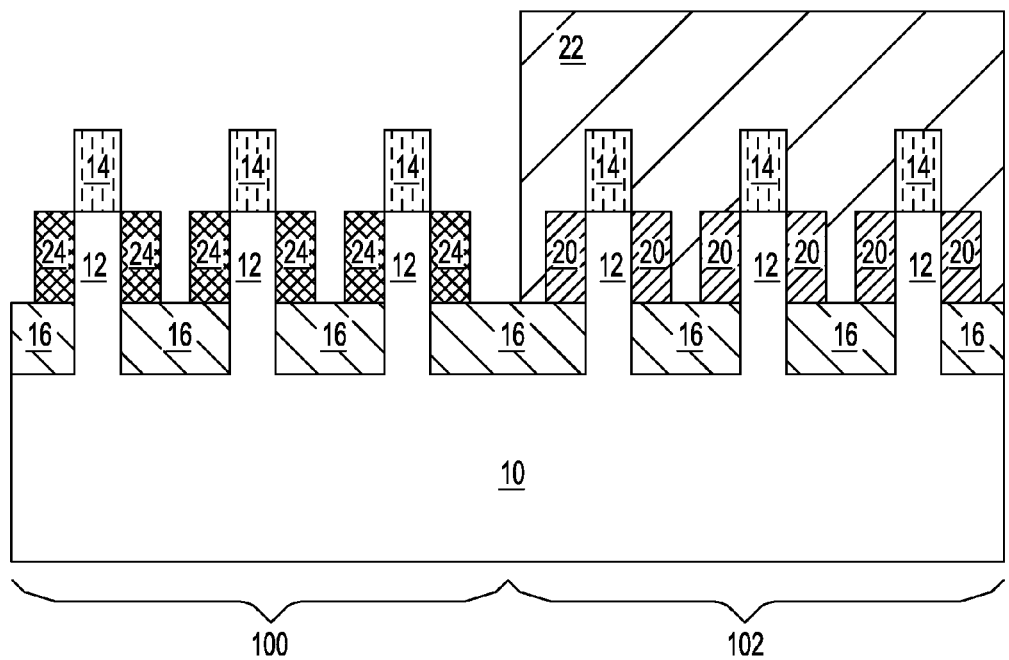
FIG. 6 is a cross sectional of the exemplary semiconductor structure of FIG. 5 after epitaxial growing an n-channel semiconductor material fin from opposing sidewalls of each semiconductor mandrel structure in the nFET device region.

Referring now to FIG. 6, there is illustrated the exemplary semiconductor structure of FIG. 5 after epitaxial growing an n-channel semiconductor material fin 24 from opposing sidewalls of each semiconductor mandrel structure 12 in the nFET device region 100. Although the present application describes and illustrates the formation of the silicon germanium alloy fins 20 prior to forming the n-channel semiconductor material fins 24, the present application also works for instances in which the n-channel semiconductor material fins 24 are formed prior to forming the silicon germanium alloy fins 20. In some embodiments, no nFET device region 100 is present and this step can be omitted.

As is shown, each n-channel semiconductor material fin 24 that is formed in the nFET device region 100 has a sidewall that contacts a sidewall of one of the semiconductor mandrel structures 12. Also, each n-channel semiconductor material fin 24 that is formed has a bottommost surface that is formed on a topmost surface of the oxide isolation structure 16. Further, and in some embodiments, each n-channel semiconductor material fin 24 that is formed has a topmost surface that is coplanar with a topmost surface of the semiconductor mandrel structure 12. In some embodiments, the topmost surface of each n-channel semiconductor material fin 24 formed in the nFET device region 100 may be located beneath a topmost surface of the semiconductor mandrel structure 12. As is shown, one sidewall surface of each n-channel semiconductor material fin 24 that is formed is vertically aligned to a sidewall edge of an underlying oxide isolation structure 16.

In one embodiment, each n-channel semiconductor material fin 24 that is formed in the nFET device region 100 may comprise a single crystalline semiconductor material that provides high-mobility for nFET devices. Examples of semiconductor materials that can be used in providing each n-channel semiconductor material fin 24 includes silicon germanium, germanium, III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In one embodiment of the present application, each n-channel semiconductor material fin 24 that is formed in the nFET device region 100 has height from 15 nm to 100 nm and a width from 4 nm to 40 nm. In another embodiment of the present application, each n-channel semiconductor material fin 24 that is formed in the nFET device region 100 has a height from 30 nm to 60 nm, and a width from 5 nm to 20 nm.

In some embodiments of the present application, each n-channel semiconductor material fin 24 has a same height as that of each silicon germanium alloy fin 20. In another embodiment, each n-channel semiconductor material fin 24 has a different height than each silicon germanium alloy fin 20. The width of each n-channel semiconductor material fin 24 may be the same or different from the width of each silicon germanium alloy fin 20.

As mentioned above, each n-channel semiconductor material fin 24 is formed by an epitaxial growth (i.e., deposition") process such as described above in providing each silicon germanium alloy fin 20. In the present application, each n-channel semiconductor material fin 24 that is formed has an epitaxial relationship with a sidewall surface of one of the semiconductor mandrel structures 12 in the nFET device region 100. A number of different source gases may be used for the deposition of each n-channel semiconductor material fin 24. In some embodiments, the source gas for the deposition of each n-channel semiconductor material fin 24 includes a silicon containing gas source or a germanium containing gas source. Carrier gases like hydrogen, nitrogen, helium and argon can be used.

As is shown in FIG. 6, each oxide isolation structure 16 includes two spaced apart semiconductor fins located thereon. In some cases, both spaced apart semiconductor fins that are located on an oxide isolation structure are silicon germanium alloy fins 20. In other cases, both spaced apart semiconductor fins that are located on an oxide isolation structure are n-channel semiconductor material fins 24. Further, one of the oxide isolation structures 16 in which the boundary of the nFET device region 100 and pFET device region 102 met includes a silicon germanium alloy fin 20 and an n-channel semiconductor material fin 24.

Figure 7:
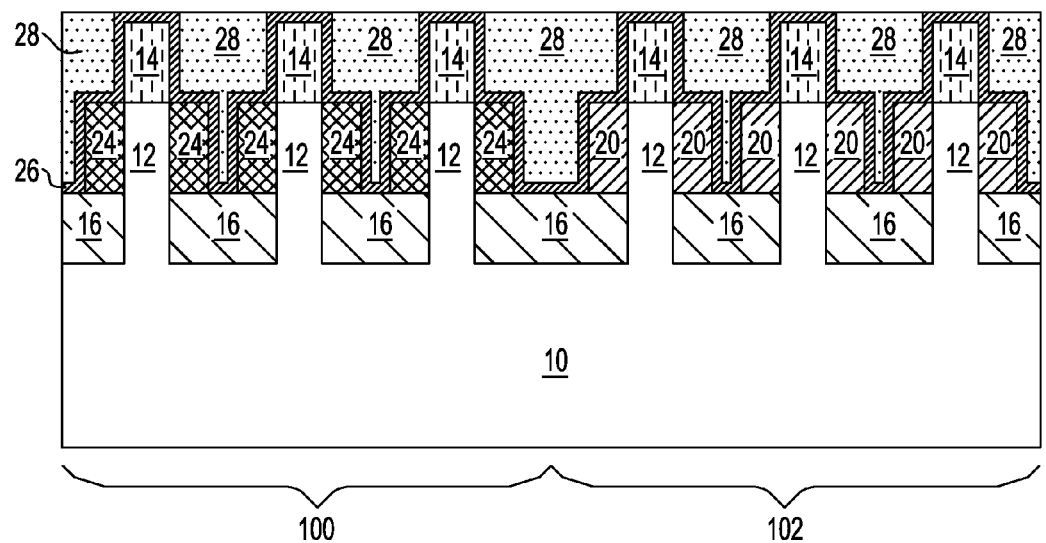
FIG. 7 is a cross sectional view of the exemplary semiconductor structure of FIG. 6 after removing the second block mask, forming a nitride-containing liner, and forming a first oxide structure on the nitride-containing liner.

Referring now to FIG. 7, there is illustrated the exemplary semiconductor structure of FIG. 6 after removing the second block mask 22, forming a nitride-containing liner 26, and forming a first oxide structure 28 on the nitride-containing liner 26. The second block mask 22 can be removed utilizing an etch back process that is selective for removing the block mask material that provides the second block mask 22.

After removing the second block mask 22, the nitride-containing liner 26 is formed on all exposed surfaces of the exemplary semiconductor structure. Notably, the nitride-containing liner 26 is formed on the exposed surfaces of the oxide isolation structures 16, exposed surfaces of each n-channel semiconductor fin 24, the exposed surfaces of each silicon germanium alloy fin 20 and the exposed surfaces of each nitride-containing hard mask cap 14.

The nitride-containing liner 26 may comprise one of the materials mentioned above in forming the blanket layer of nitride-containing hard mask material. In one embodiment, the nitride-containing liner 26 comprises a same nitride-containing material as that of the blanket layer of nitride-containing hard mask material. In one example, the nitride-containing liner 26 and the blanket layer of nitride-containing hard mask material both comprise silicon nitride. In one embodiment, the nitride-containing liner 26 comprises a different nitride-containing material as that of the blanket layer of nitride-containing hard mask material. In one example, the nitride-containing liner 26 comprises a silicon oxynitride, while the blanket layer of nitride-containing hard mask material comprises silicon nitride. The nitride-containing liner 26 is a conformal layer that can be used in the present application as an etch stop layer. The nitride-containing liner 26 can be formed by CVD, PECVD or physical vapor deposition (PVD). The horizontal thickness and laterally thickness of the nitride-containing liner 26 is the same and can be from 1 nm to 15 nm. Other thicknesses that are lesser than, or greater than, the aforementioned thickness range can also be used as the thickness of the nitride-containing liner 26.

After providing the nitride-containing liner 26, the first oxide structure 28 is then formed. The first oxide structure 28 comprises an oxide material that can fill the gaps (i.e., a gap filling oxide material) within the exemplary semiconductor structure. In one embodiment, the first oxide structure 28 comprises an oxide that can be derived from TEOS (tetraethylorthosilicate). In another embodiment, the first oxide structure 28 may comprise a flowable oxide such as, for example, silicon oxide containing hydrogen and carbon. The first oxide structure 28 can be formed by utilizing a deposition process such as, for example, CVD or PECVD. A planarization process such as, for example, chemical mechanical polishing and/or grinding may follow the deposition of the oxide material that provides the first oxide structure 28. The first oxide structure 28 has a topmost surface that is coplanar with a topmost surface of the nitride-containing layer 26 that is present on the topmost surface of each nitride-containing hard mask cap 14.

Figure 8:
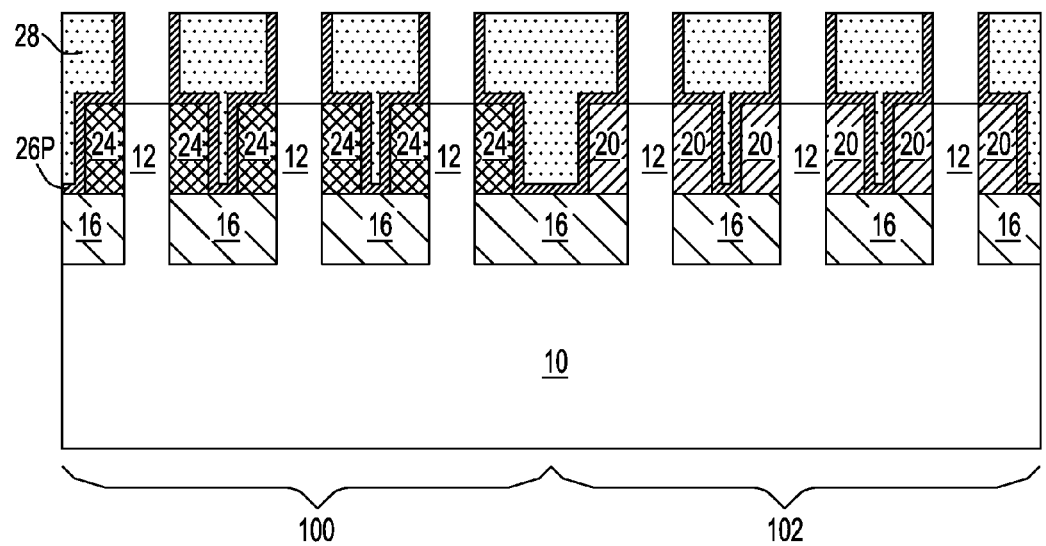
FIG. 8 is a cross sectional view of the exemplary semiconductor structure of FIG. 7 after removing an exposed portion of the nitride-containing liner and an nitride-containing hard mask cap that are located above each semiconductor mandrel structure.

Referring now to FIG. 8, there is illustrated the exemplary semiconductor structure of FIG. 7 after removing an exposed portion of the nitride-containing liner 26 and the nitride-containing hard mask cap 14 that are located above each semiconductor mandrel structure 12. The remaining portion of the nitride-containing liner 26 may be referred to herein as a nitride-containing liner portion 26P.

The structure shown in FIG. 8 can be formed utilizing an anisotropic etching process that is selective in removing a nitride-containing dielectric material. In one example, a reactive ion etch can be used to provide the structure shown in FIG. 8 of the present application. In some embodiments, a single anisotropic etch can be used to remove exposed portions of the nitride-containing liner 26 and the underlying nitride-containing hard mask cap 14. In another embodiment, a first anisotropic etch is used to remove the exposed portion of the nitride-containing liner 26, followed by a second anisotropic etch to remove the underlying nitride-containing hard mask cap 14 from the structure.

Figure 9:
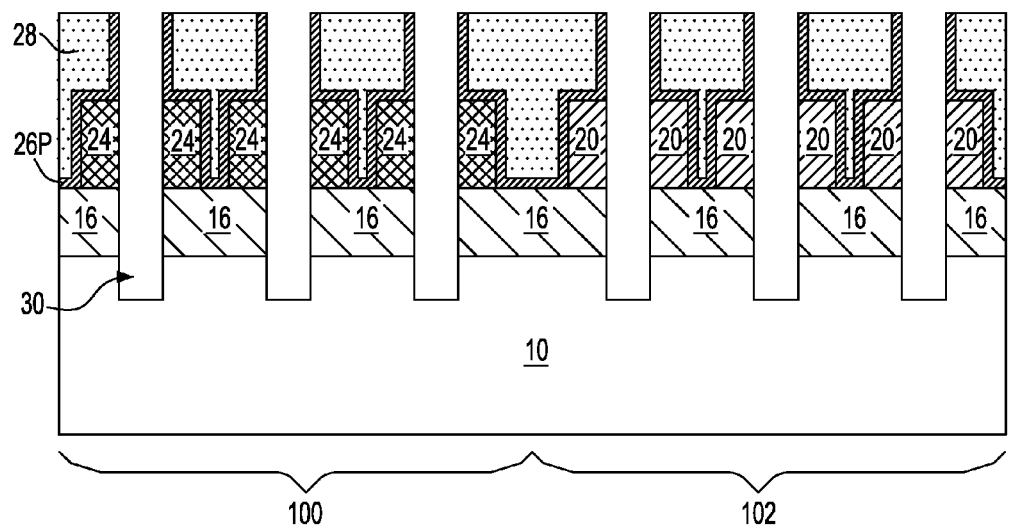
FIG. 9 is a cross sectional view of the exemplary semiconductor structure of FIG. 8 after removing each semiconductor mandrel structure and providing a recessed region in the remaining portion of the semiconductor substrate.

Referring now to FIG. 9, there is illustrated the exemplary semiconductor structure of FIG. 8 after removing each semiconductor mandrel structure 12 and providing a recessed region 30 in the remaining portion of the semiconductor substrate 10. The structure shown in FIG. 9 can be formed utilizing an anisotropic etching process that is selective in removing the semiconductor material that defines each semiconductor mandrel structure 12. In one example, a reactive ion etch can be used to provide the structure shown in FIG. 9 of the present application.

Figure 10:
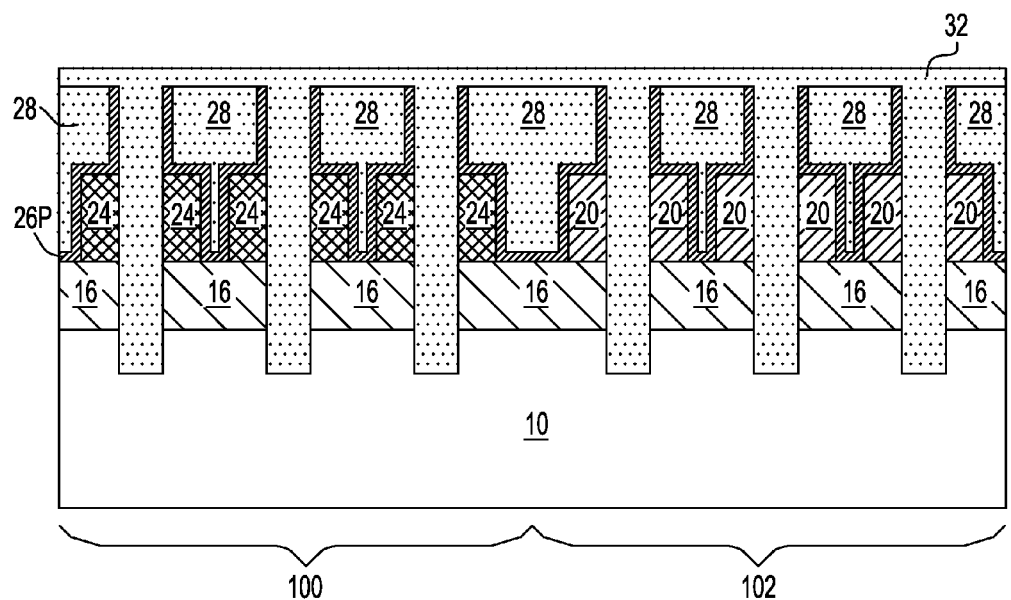
FIG. 10 is a cross sectional view of the exemplary semiconductor structure of FIG. 9 after forming a second oxide structure within the volume occupied by each semiconductor mandrel structure and the recessed region.

Referring now to FIG. 10, there is illustrated the exemplary semiconductor structure of FIG. 9 after forming a second oxide structure 32 within the volume occupied by each semiconductor mandrel structure 12 and the recessed region 30. The second oxide structure 32 may comprise one of the materials mentioned above in providing the first oxide structure 28. In one embodiment, the second oxide structure 32 comprises a same gap filling oxide material as that used in providing the first oxide structure 28. In such an embodiment, there is no material interface present between the first oxide structure 20 and the second oxide structure 32. In another embodiment, the second oxide structure 32 comprises a different gap filling oxide material than hat used in providing the first oxide structure 28. In such an embodiment, a material interface is present between the first oxide structure 28 and the second oxide structure 32.

Figure 11:
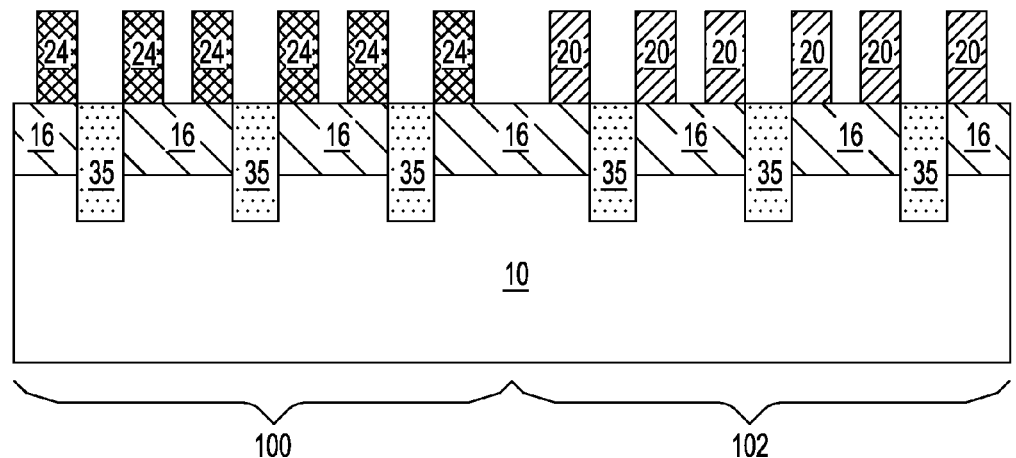
FIG. 11 is a cross sectional view of the exemplary semiconductor structure of FIG. 10 after exposing the topmost surface and the sidewall surfaces of each n-channel semiconductor material fin and each silicon germanium alloy fin.

Referring now to FIG. 11, there is illustrated the exemplary semiconductor structure of FIG. 10 after exposing the topmost surface and the sidewall surfaces of each n-channel semiconductor material fin 24 and each silicon germanium alloy fin 20. This step of the present application comprises one or more oxide removal processes to remove the second oxide structure 32 and the first oxide structure 28 that is present atop the remaining portion of the semiconductor substrate 10; a portion of the second oxide structure that is located between each oxide isolation structure 16 and is present in each recessed region 30 remains and provides a second oxide isolation structure 35 (element 16 represents a first oxide isolation structure of the present application). Each of the second oxide isolation structures 35 has a bottommost surface that is located beneath (i.e., is deeper than) the bottommost surface of oxide isolation structure 16. Each of the second oxide isolation structures 35 can be referred to as a deep oxide isolation region, while each of the first oxide isolation structures 16 can be referred to herein as a shallow oxide isolation region. In one embodiment, the one or more oxide removal processes comprises a planarization process followed by an etch back process. Next, remaining portions of the nitride-containing liner 26 can be removed utilizing an etching process that selectively removes nitride.

Figure 12:
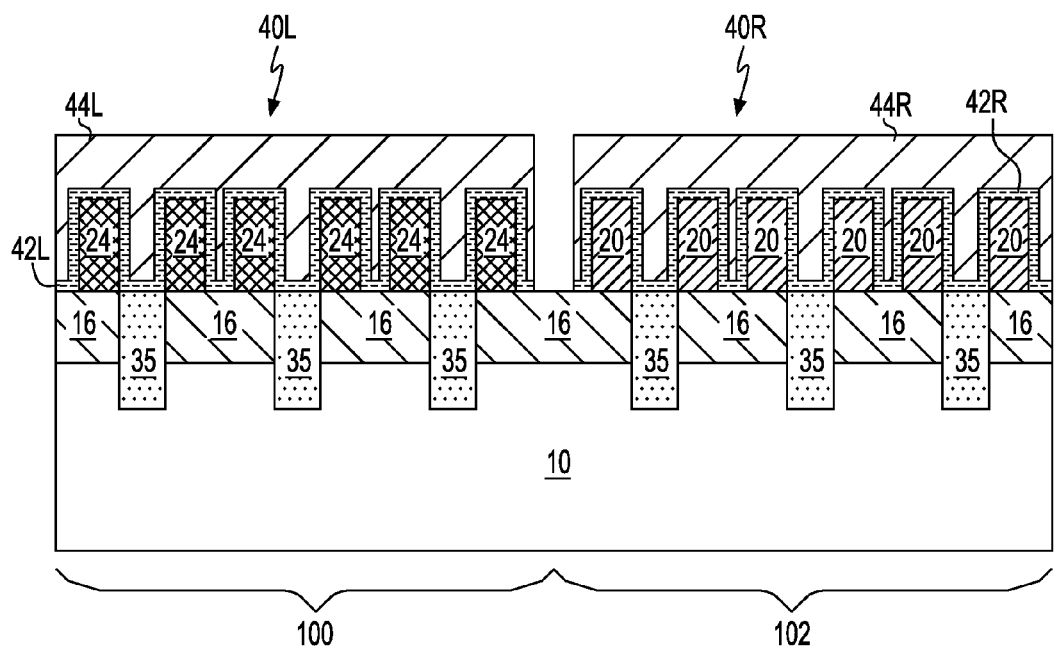
FIG. 12 is a cross sectional view of the exemplary semiconductor structure of FIG. 11 after formation of a first functional gate structure straddling a portion of each n-channel semiconductor material fin and forming a second functional gate structure straddling a portion of each silicon germanium alloy fin.

Referring now to FIG. 12, there is illustrated the exemplary semiconductor structure of FIG. 11 after formation of a first functional gate structure 40L straddling a portion of each n-channel semiconductor material fin 24 and forming a second functional gate structure 40R straddling a portion of each silicon germanium alloy fin 20.

By "functional gate structure" it is meant a permanent gate structure used to control output current (i.e., flow of carriers in the channel) of a semiconducting device through electrical or magnetic fields. The first functional gate structure 40L includes a first gate material stack of, from bottom to top, a first gate dielectric portion 42L, and a first gate conductor portion 44L. In some embodiments (not shown), a gate cap portion can be present atop the first gate conductor portion 44L. The second functional gate structure 40R includes a second gate material stack of, from bottom to top, a second gate dielectric portion 42R, and a second gate conductor portion 44R. In some embodiments (not shown), a gate cap portion can be present atop the second gate conductor portion 44R. Although a single first functional gate structure 40L and a single second functional gate structure 40R are described and illustrated, a plurality of first and second functional gate structures (40L, 40R) can be formed.

Each gate dielectric portion 42L, 42R comprises a dielectric material. The gate dielectric material that provides each gate dielectric portion 42L, 42R can be an oxide, nitride, and/or oxynitride. In one example, the gate dielectric material that provides each gate dielectric portion 42L, 42R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion 42L, 42R.

The gate dielectric material used in providing each gate dielectric portion 42L, 42R can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion 42L,42R. In some embodiments, each gate dielectric portion 42L, 42R comprises a same gate dielectric material. In other embodiments, first gate dielectric portion 42L may comprise a first gate dielectric material, while second gate dielectric portion 42R may comprise a second gate dielectric material that differs in composition from the first gate dielectric material. When a different gate dielectric material is used for the gate dielectric portions 42L, 42R, block mask technology can be used. In one embodiment of the present application, the gate dielectric material used in providing each gate dielectric portion 42L, 42R can have a thickness in a range from 1 nm to 10 nm. Other thicknesses that are lesser than, or greater than, the aforementioned thickness range can also be employed for the gate dielectric material.

Each gate conductor portion 44L, 44R comprises a gate conductor material. The gate conductor material used in providing each gate conductor portion 44L, 44R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 44L, 44R may comprise a same gate conductor material. In another embodiment, the first gate conductor 44L may comprise a different gate conductor material than the second gate conductor 44R.

The gate conductor material used in providing each gate conductor portion 44L, 44R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions 44L, 44R, block mask technology can be used. In one embodiment, the gate conductor material used in providing each gate conductor portion 44L, 44R has a thickness from 1 nm to 100 nm. Other thicknesses that are lesser than, or greater than, the aforementioned thickness range can also be employed for the gate conductor material used in providing each gate conductor portion 44L, 44R.

Each gate cap portion comprises a gate cap material. The gate cap material that provides each gate cap portion may include a hard mask material such as, for example, silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure 40L, 40R can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application (not shown), sacrificial gate structures are first formed. By sacrificial gate structure" it is meant a material or material stack that serves as a placeholder for a subsequently formed functional gate structure. In such an embodiment, the gate dielectric portion of the functional gate structures may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portions of the functional gate structures. The sacrificial gate material portion includes one of the gate conductor materials mentioned above for gate conductor portions of the functional gate structures. The sacrificial gate dielectric portion includes one of the gate cap material mentioned above for gate cap portions of the functional gate structures. The sacrificial gate structures can be formed by deposition of the various material layers and then patterning the resultant sacrificial material sack by utilizing, for example, lithography and etching. The sacrificial gate structures are replaced after forming source/drain regions.

Source/drain regions (not shown) are formed in exposed portions of each n-channel semiconductor material fin 24 and each silicon germanium alloy fin 20 that are not covered by either the functional gate structures or the sacrificial gate structures; in the drawing the source/drain regions would be located in front of the plane of the drawing and behind the plane of the drawing. The source/drain regions can be formed utilizing conventional techniques such as, for example, epitaxial growth, which are well known to those skilled in the art. As is known, the source region would be located on one side of each functional gate structure and the drain region would be located on another side of each functional gate structures. In some embodiments, the source/drain regions can be unmerged. In yet other embodiments, the source/drain regions can be merged.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    providing a structure comprising a plurality of semiconductor mandrel structures containing a nitride-containing hard mask cap and extending upward from a semiconductor substrate, wherein a first oxide isolation structure is located between each semiconductor mandrel structure and on exposed portions of said semiconductor substrate;
    forming a silicon germanium alloy fin on opposing sidewalls of each semiconductor mandrel structure in a pFET device region of said semiconductor substrate, wherein each silicon germanium alloy fin has a bottommost surface that directly contacts a topmost surface of one of said first oxide isolation structures;
    removing each nitride-containing hard mask cap and each semiconductor mandrel structure adjoining each silicon germanium alloy fin; and
    forming a second oxide isolation structure between each first oxide isolation structure, said second oxide isolation structure having a topmost surface coplanar with a topmost surface of each first oxide isolation structure and a bottommost surface that is deeper than a bottommost surface of each first oxide isolation structure.

2. The method of claim 1, further comprising forming a functional gate structure straddling each silicon germanium alloy fin.

3. The method of claim 1, wherein one sidewall surface of each silicon germanium alloy fin is vertically aligned to a sidewall edge of one of said first oxide isolation structures.

4. The method of claim 1, wherein prior to forming said silicon germanium alloy fins, a block mask is formed over each semiconductor mandrel structure within an nFET device region of said semiconductor substrate.

5. The method of claim 4, further comprising:
    removing said block mask over each semiconductor mandrel structure within said nFET device region;
    forming another block mask over said silicon germanium alloy fins and said semiconductor mandrel structures in said pFET device region;
    forming n-channel semiconductor material fins from opposing sidewalls of each semiconductor mandrel structure and directly on a topmost surface of one of said first oxide isolation structure in said nFET device region; and
    removing said another bock mask.

6. The method of claim 5, where said removing each semiconductor mandrel structure adjoining each silicon germanium alloy fin, further removes each semiconductor mandrel structure adjoining each n-channel semiconductor material fin.

7. The method of claim 6, further comprising forming a functional gate structure straddling each n-channel semiconductor material fin.

8. The method of claim 1, wherein said forming said silicon germanium alloy fin comprises an epitaxial growth process.

9. The method of claim 1, wherein said removing each semiconductor mandrel structure adjoining each silicon germanium alloy fin comprises:
- forming a nitride-containing liner surrounding each silicon germanium alloy fin and atop each nitride-containing hard mask cap;
- forming a first oxide structure having a topmost surface that is coplanar with a topmost surface so said nitride-containing liner that is located atop each nitride-containing hard mask cap;
- removing a portion of said nitride-containing liner located above each semiconductor mandrel structure;
- removing each nitride-containing hard mask cap; and
- performing an anisotropic etch to remove each semiconductor mandrel structure.

10. The method of claim 9, wherein said anisotropic etch forms a recessed region in said semiconductor substrate, and wherein a lower portion of said second oxide isolation structure is present in said recessed region.

* * * * *